United States Patent [19]

Clemen et al.

[11] 4,238,841
[45] Dec. 9, 1980

[54] DYNAMIC SEMICONDUCTOR MEMORY READ/WRITE ACCESS CIRCUIT

[75] Inventors: Rainer Clemen, Boeblingen; Joerg Gschwendtner, Esslingen; Werner Haug, Boeblingen, all of Fed. Rep. of Germany

[73] Assignee: International Business Machines Corporation, Armonk, N.Y.

[21] Appl. No.: 103,796

[22] Filed: Dec. 14, 1979

[30] Foreign Application Priority Data

Dec. 20, 1978 [DE] Fed. Rep. of Germany ....... 2855118

[51] Int. Cl.$^3$ .............................................. G11C 11/40
[52] U.S. Cl. .................................... 365/203; 307/279; 365/208
[58] Field of Search ............... 365/174, 182, 203, 208; 307/238, 279, 289, 290, 291

[56] References Cited

U.S. PATENT DOCUMENTS

| 3,387,286 | 6/1978 | Dennard | 365/182 |
| 4,053,873 | 10/1977 | Freeman | 365/182 |
| 4,112,512 | 9/1978 | Arzubi | 365/203 |
| 4,125,878 | 11/1978 | Watanabe | 365/208 |

*Primary Examiner*—Terrell W. Fears
*Attorney, Agent, or Firm*—Howard J. Walter, Jr.

[57] ABSTRACT

To the known sense latch already existing in a bit line pair in an FET memory, and to the two bit switches in each bit line another latch is arranged in series which furthermore is coupled to the common data input and output via a write driver on the one side and a read driver on the other. Both latches are of an identical structure and controlled by the same pulses in the read as well as in the write phase. The data path via the write driver and the read driver up to, or from, the additional latch is respectively designed as unidirectional double rail line, and selectively connectable via the bit switches with the bidirectional double rail line to the respective bit line pair.

5 Claims, 4 Drawing Figures

DYNAMIC SEMICONDUCTOR MEMORY READ/WRITE ACCESS CIRCUIT

BACKGROUND OF THE INVENTION

1. Field of the Invention

This invention relates to a circuit arrangement for providing input/output data coupling for bipolar transistor-compatible dynamic field-effect transistor memory circuits.

2. Description of the Prior Art

Large scale integrated memories including capacitors and field effect transistors are known in principle. U.S. Pat. No. 3,387,286 to Dennard describes a capacitive word-oriented memory whose memory cells consist of one field effect transistor and one capacitor each, one transistor connection being connected to the capacitor and the other to the bit line, the gate electrode being connected to the word line and the substrate to an operating voltage source.

Such a one-device cell has the advantage that it permits a high integration density with a relatively simple manufacturing process. The disadvantage of this memory cell, however, is that the writing-in and reading-out of the information is relatively slow.

The ever-increasing packing density of such memories, however, presents considerable problems in that the signal in the reading-out or sensing of the contents of a memory cell is so small that it is difficult to detect reliably. On the one hand this calls for extremely complicated sensing circuits, and on the other for precisely maintaining duration and levels of a control signal sequence. The signal sequence for a reading operation normally differs from that for a writing operation so that many auxiliary circuits are required in order to operate such a memory. Furthermore, the working speed decreases with an increasing size of the signal sensed.

In order to provide faster writing and reading cycles integrated dynamic semiconductor memories have been equipped with two-device cells. Such a memory with two independent storage capacitors, each accessible via one field effect transistor, has become known from *IBM Technical Disclosure Bulletin*, Vol. 18, No. 3, August 1975, pages 786 and 787, and from German Offenlegungeschrift No. 2,431,079. There, each memory cell is composed of two storage capacitors and two serially connected write/read field effect transistors. These series arrangements are provided between the two bit lines of a bit line pair and one common point of connection which is AC-connected to ground. A common word line joins the control electrodes of the two transistors. When the information of an addressed storage cell is read out, the differential signal on the bit line pair is applied to a latch for amplification.

This circuit arrangement permits a high writing and reading speed with a relatively simple control signal sequence.

For further improving the memory cycle time and for making the time control less complicated, U.S. Pat. No. 4,112,512 to Arzubi et al teaches a circuit which includes an early selection of the decoded bit line switches which are required for coupling memory cell array areas to data input/output lines, with a low level control pulse so that, as a function of the developing differential signal which is applied by a memory cell to the associated bit line pair and which is preferably pre-amplified, the switch-on threshold is exceeded for only one of the two bit line switches, whereas the bit line switch in the other bit line remains non-conductive and thus prevents a decrease of the potential of this bit line and of the cell node connected thereto.

Any further reduction of the access time by shortening the periods for sensing of the stored data is not possible without additional technical steps since, with shorter sensing time, the signal level of the information would no longer be reliably detectable.

Such circuit arrangements with dynamic one or two device cells have the further disadvantage that the sense latch for highly integrated TTL-compatible memory chips alone is not sufficient for the quick translation of the extremely small differential voltage into TTL signals, particularly when the data path to or from the memory cells shows a high capacity. This is particularly true when the parasitic capacity of the internal data bus to which the many bit lines are connected considerably reduces the writing and reading speed and furthermore affects a reliable detection and transfer of the information.

Another sensing arrangement known in the prior art is described in the *IBM Technical Disclosure Bulletin*, Vol. 17, No. 5, October 1974, pages 1361-2. There a pair of cross-coupled latches are provided which act in tandem to improve the performance of a memory access cycle. Such an arrangement is known to have been used in conjunction with a D.C. stable semiconductor memory cell as described in U.S. Pat. No. 3,949,385. In order to provide increased sensitivity to a stored information signal, a first preamplifier latch is set at approximately the same time as the bit switches are enabled, coupling a pair of bit lines within an array to a pair of common bit lines. The second latch is set shortly thereafter such that the preamplifier latch which has already amplified the information is used to provide a signal to set the second latch. A read output circuit is coupled to one of the common bit lines and is used to sense the signal on that common bit line in order to develop an output signal. Although not illustrated in the above two references, writing of data into the memory cells is accomplished, using the same timing signals, via a complementary driver circuit, responsive to a write signal, which enables the discharge of one of the common bit lines at a time prior to the setting of either latch and after the enabling of the bit switches. U.S. Pat. No. 4,125,878 to Watanabe teaches a somewhat similar arrangement in an array of one-device memory cells, however, the second sequential latch is effective only during a cycle in which information is read out of a memory cell but not during the writing of information. Additional sub-combination arrangements have been disclosed for providing output signal driving circuits, such as found in U.S. Pat. No. 4,053,873 to Freeman et al, which teaches a push-pull driver circuit which is coupled to the output of a double rail sense amplifier by a pair of switches enabled by a memory enable clock signal such that data sensed on a particular memory cycle is available only at the end of each memory access cycle.

SUMMARY OF THE INVENTION

It is therefore the object of this invention to provide a circuit arrangement for a TTL-compatible data path in an integrated semiconductor memory with dynamic FET memory cells which are arranged in a matrix of word lines and bit line pairs, and which are connected to read and write drivers, said circuit arrangement permitting, in spite of an increase of integration density as well as an increase of writing and reading speed, a reliable sensing of the stored data without requiring complicated control signal sequences.

The solution according to the invention consists in providing a pair of sequentially enabled latch circuits coupled to a dual rail memory cell in which independent dual rail write and read drivers are provided which are coupled to a common data input/output terminal to provide TTL compatibility directly between a field effect transistor memory circuit and bipolar TTL logic circuitry.

This short writing or access time and the high reliability are achieved by the easily time-controlled co-action of the additional latch with the write and read driver on the one hand, and the early selection of the bit switches on the other.

The foregoing and other objects, features and advantages of the invention will be apparent from the following more particular description of the preferred embodiment of the invention, as illustrated in the accompanying drawings.

DESCRIPTION OF THE PREFERRED EMBODIMENT

Figure 1:
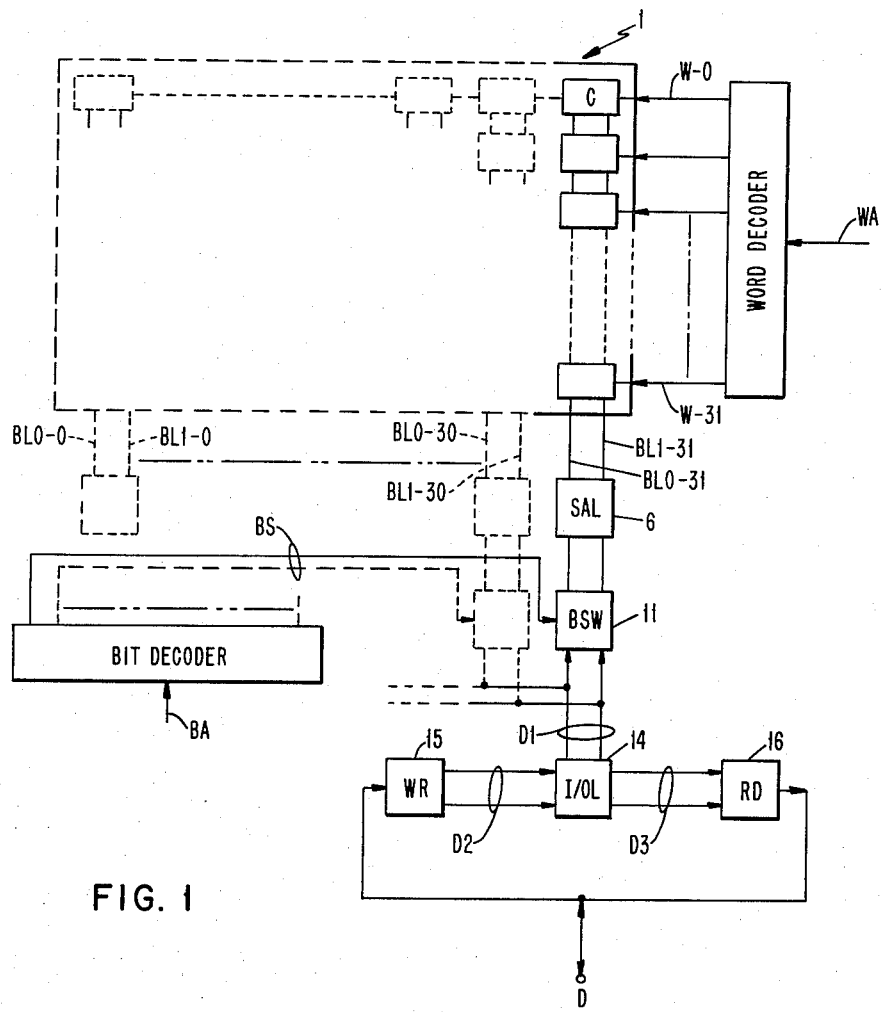
FIG. 1 is a block diagram of an integrated semiconductor memory with a common data input and output.

Referring to the block diagram of FIG. 1, the basic structure of the circuit arrangement according to the invention will be described. Highly integrated memory matrix 1 contains dynamic memory cells C with two capacitors and two field effect transistors. The cells are addressable via word decoders and bit decoders. Memory cells C are located at the intersection of each word line W and of a bit line pair BL0, BL1. When a specific word address WA is applied at the input of the word decoder and a bit address BA to the input of the bit decoder, that cell C of storage matrix 1 is selected which is in the point of intersection of the selected word line and of the selected bit line pair. Each bit line pair BL0, BL1 has an associated sense latch circuit 6 which during reading senses selected memory cell C and takes over its stored information. A bit line pair is selected via the bit decoder and bit switch selector line BS. By a bit switch 11, bit line pair BL0, BL1 and the data line, designed here as a bidirectional double rail line D1, are connected to each other. To line D1 another latch, the I/O-latch 14 is connected. Latch 14 during reading receives the information from sense latch 6 acting as pre-amplifier, and further amplifies the associated differential voltage signal. This I/O-latch 14 is connected via one respective data path, designed as a common unidirectional double rail line D2 and D3, to a write driver 15 on the one hand and to a read driver 16 on the other. The output of read driver 16 and the input of the write driver 15 are both connected to the external data line D. Data line D is designed as a bidirectional single rail line so that it can transfer data which is to be entered into the memory as well as that which is to be read out of the memory. A signal, not shown, that is applied to the word decoder, the bit decoder, the I/O-latch 14, the write driver 15 and the read driver 16 serves to prepare these circuits for operation and can be compared to the signal CHIP ENABLE known from other memories.

Since the internal data lines are largely decoupled from the external data line so that no external noise can penetrate into the memory, the cycle time of the memory depends mainly on the internal parasitic capacities. By adding another amplifier in the form of I/O-latch 14 the damaging influence of the capacity which is high owing to the memory organization, of the internal data bus, D1 to D3 in the drawing, is minimized, without the time control of the data path being complicated thereby.

The read and write operation will be explained in detail in reference to FIG. 2 and its pulse diagrams in FIGS. 3 and 4.

Although the circuit arrangement is described in connection with a dynamic memory cell consisting of two field effect transistors and two capacitors, the invention is not limited to this specific type of memory cell; any dynamic memory cell selectable via a bit line pair and a word line, particularly a bipolar dynamic cell, can be operated in exactly the same manner without any inventive steps being involved.

Figure 2:
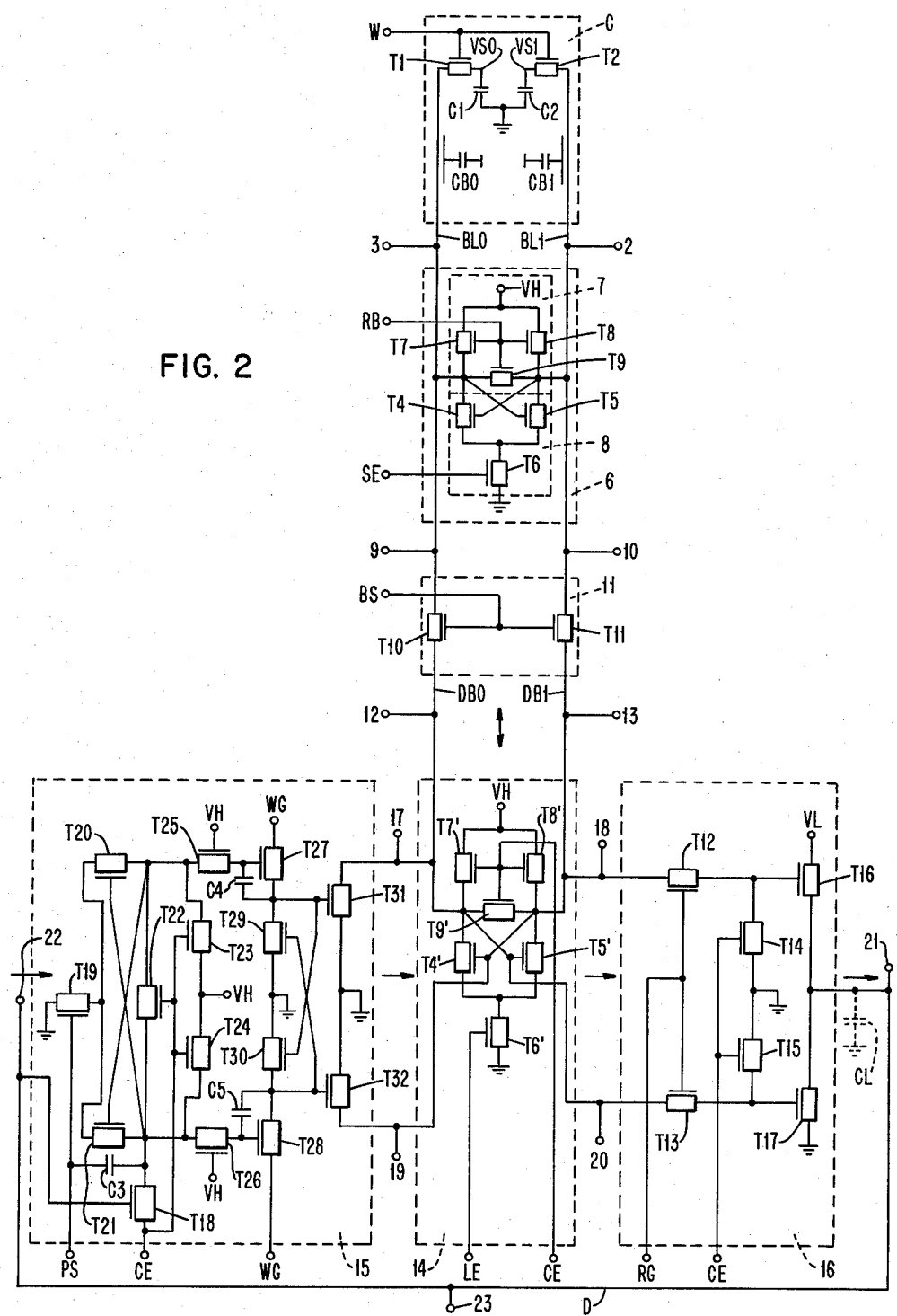
FIG. 2 is a circuit arrangement for increasing the read/write time of a memory with dynamic memory cells and TTL-compatible data input/output in the processing of very small signals.

FIG. 2 shows the circuit schematic for controlling and operating the data path of a semiconductor matrix memory with dynamic memory cells C each consisting of two capacitors C1 and C2 as well as of two field effect transistors T1 and T2.

Such a two-transistor memory cell C is of a symmetrical design in that, with respect to each of the two bit lines BL0 and BL1, a selectable connection is provided via the write/read field effect transistors T1 and T2 to one of the two memory capacitors C1 and C2. With their other electrode, capacitors C1 and C2 are connected to a fixed potential, i.e., AC-connected to ground. The word line W is connected to the two control electrodes of transistors T1 and T2. By a corresponding addressing signal WS on this word line the two transistors T1 and T2 of the memory can be switched on, and via bit lines BL0 and BL1 the information represeted by the respective complementary charged state of the memory capacitors C1 and C2 can be read out, refreshed, or changed. In the box comprising a series of such memory cells C the total parasitic bit line capacities CB0 and CB1 are also shown symbolically. Nodes 2 and 3 represent the input or output, respectively of the memory cells, depending on whether there is a writing or a reading operation. Connected to the two nodes 2 and 3 of memory cell C a sense latch 6 is provided which in turn consists of a refresh circuit 7 and a clock-controlled latch 8. The very small differential signal appearing between nodes 2 and 3, as supplied by cell C during reading, is preamplified by the clock-controlled latch 8, i.e., the actual read amplifier. This clock-controlled latch 8 consists of the cross-coupled transistors T4 and T5 and transistor T6 inserted in their common source line. Transistor T6 is switched on by a clock pulse SE so that cross-coupled field effect transistors T4 and T5 are applied to the operating voltage, in the present case ground potential. This read amplifier therefore is a flip-flop, which owing to the absence to D.C. load elements and the (initial) isolation from the rather high data line capacities, begins to set very quickly. The upper circuit part of sense latch 6 represents the refresh circuit 7 and comprises transistors T7 to T9. The gate electrodes of these transistors are connected to each other and to the control input to which control pulse RB had previously been applied.

Figure 3:
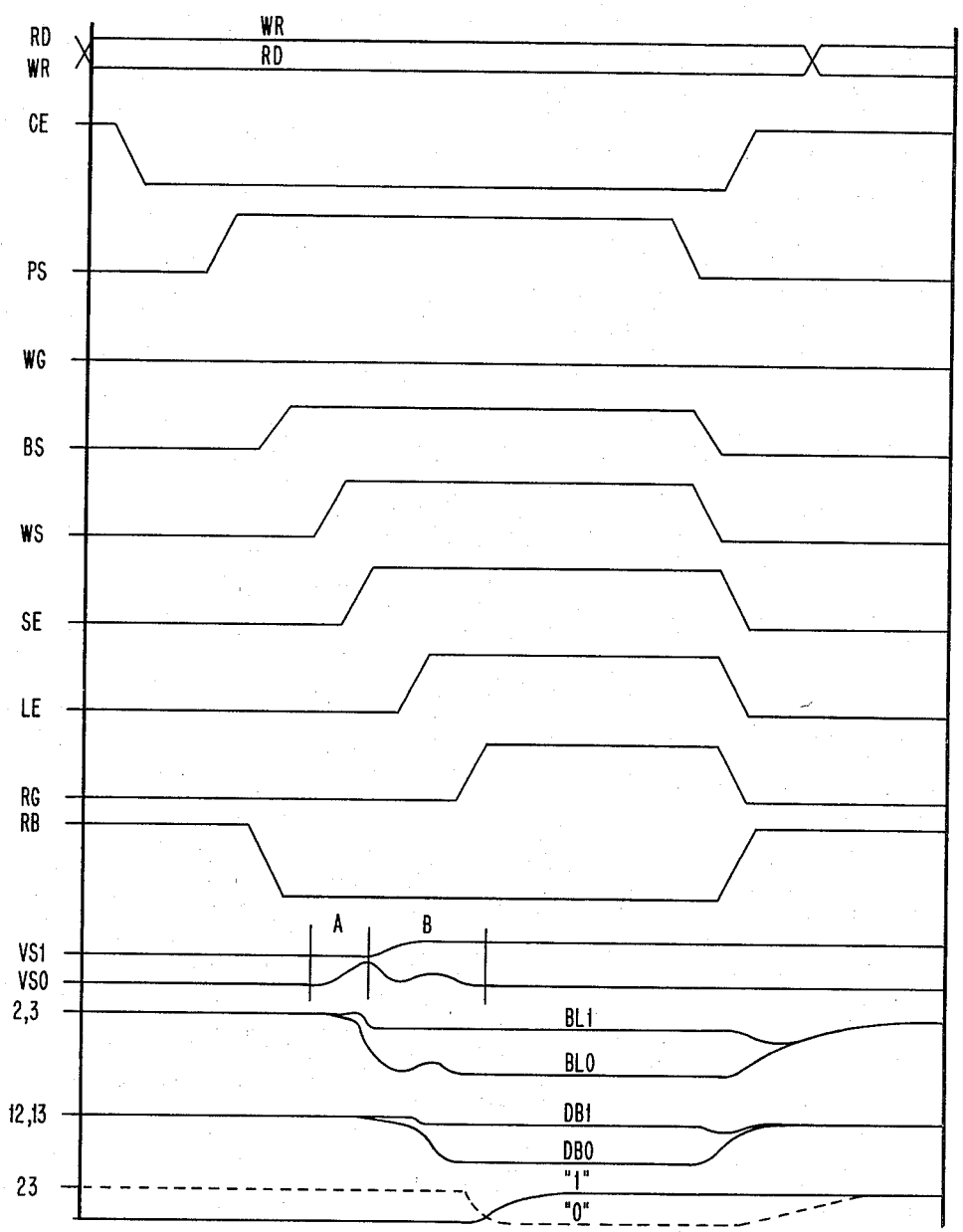
FIGS. 3 and 4 are pulse diagrams for the circuit arrangement in accordance with FIG. 2.

It is pointed out here that control signals RB and SE are not simultaneously at their active levels, i.e., at their upper voltage level, at any time (see FIG. 3). Consequently, refresh transistors T7 and T8 do not act as load elements of cross-coupled transistors T4 and T5, so that in addition to the high switching speed there is the advantage that there is no D.C. power dissipation in sense latch 6.

Nodes 9 and 10 of sense latch 8 are connected to bit switch 11 consisting of transistors T10 and T11. Bit switch 11 selectively enables the connection of bit lines BL0 and BL1 with the data lines designed as a bidirectional double rail line DB0 and DB1. The common control input for transistors T10 and T11 receives a selection pulse BS whose amplitude is selected (VH-VT) that as a function of the developing differential signal which is transferred from memory cell C to the associated bit line pair BL0, BL1, and amplified, the switching-on threshold of the transistors is widely exceeded only for one of transistors T10 or T11, with the other one remaining non-conductive, as described in further detail in U.S. Pat. No. 4,112,512 to Arzubi et al.

Such a pulse amplitude at bit switch 11 permits the early selection and consequently a considerable independence of the memory access time with respect to time of selection pulse BS, as the bit line which is to maintain its high standby potential (approximately VH), and to refresh the connected memory node, remains completely isolated from the respective data line and can therefore not be influenced by its low potential (approximately VH-VT).

To bidirectional double rail line DB0, DB1 a clock-controlled I/O-latch 14 is connected. Latch 14 is substantially identical to clock-controlled sense latch 6. As the structure of the two latches 6 and 14 is identical, no further reference will be made thereto. All transistors of I/O-latch 14 have the same designations as those of the above described circuit. The reference numbers of the components merely show an additional small apostrophe.

During the reading of an information signal from a cell C the lower part of clock-controlled I/O-latch 14 amplifies the differential signal applied between nodes 12 and 13, while the upper part is active during the refresh phase.

From I/O-latch 14 the bit line pair DB0, DB1 is coupled via write driver 15 (connecting gate 17, 19) on the one hand, and via read driver 16 (connecting gate 18, 20) on the other, in both cases unidirectionally, to data line D.

The read driver 16 consists of transistors T12 to T17 and is connected at its output 21 via data line D to input 22 of write driver 15. Data line D in turn has a point of connection 23 from which during reading data can be read out, and read in during writing.

For explaining the operation of read driver 16 during reading, it is now assumed that after the activation of I/O-latch 14 a differential voltage has formed at the output (nodes 18 and 20), one node having assumed potential VH-VT and the other node the potential 0 V. At this time, signal CE is at 0 V so that transistors T14 and T15 are non-conductive. If signal RG now rises from 0 V to VH, transfer transistors T12 and T13 are switched on and the complementary information signal on nodes 18 and 20 is transferred to the gate electrodes of the two output transistors T16 and T17. Upon the reading out of a logic Zero according to the levels VH-VT at node 20 and 0 V at node 18, respectively at inputs DB0 and DB1 of read driver 16, discharge transistor T17 is conductive and charge transistor T16 non-conductive. After the discharge of load capacity CL, there is a potential of 0 V at data output 21, that potential corresponding to the stored logic Zero data signal.

With a logic One, the potential VH-VT at input node 18 and the potential 0 V at node 20, charge transistor T16 is switched on and discharge transistor 17 is switched off, so that load capacity CL is charged and there appears at node 21 potential VL representing a stored One.

At the end of the selection phase, signal RG moves from the upper level VH to the lower level 0 V so that transfer transistors T12 and T13 are switched off. Thus, output transistors T16 and T17 are separated from nodes 18 and 20, i.e., the output of read driver 16 is isolated from I/O-latch 14. Subsequently, signal CE rises so that transistors T14 and T15 are switched on, and transistors T16 and T17 are both switched off. In this manner, data output 21 is separated from the input 22 of the read driver 16 in the standby state.

The pulse diagram for the read operation is shown in FIG. 3. The upper row shows the signal curve of writing and reading signals WR and RD, the second row shows the chip selection signal CE, and the third one the signal curve PS in the output of a phase split driver not shown in the diagram. Thereberneath, the signal curve for write signal WG is shown which in a read operation is always on zero level. Then there follow the signals for bit selections BS and word selection WS, then the switch-on signals SE for sense latch 6, LE for I/O-latch 14, RG for read driver 16, signal RB for the re-charging of the bit lines, as well as potential curves VS0 and VS1 at the points of the memory cell which are marked in FIG. 2, BL0 and BL1 on the bit line pair, DB0 and DB1 on the data lines DB1 at nodes 12 and 13, and finally the voltage curve at the data output of the memory, i.e., at node 23 for a read One or Zero, respectively. Section A in the voltage curve of VS1 and VS0 shows the time period in which destructive readout of the information in cell C occurs, and the following section B shows the time period in which the information is rewritten.

The write operation will now be described by reference to FIGS. 2 and 4, i.e., the writing-in of a One or of a Zero. The TTL signal to be written in is applied at node 23 of the circuit in accordance wih FIG. 2, and from there passes on to data input 22 of write driver 15. Write driver 15 consists of five stages: a refresh stage with transistors T22 to T24, an input stage with transistor T18 and capacitor C3, a latch with transistors T19 to T21, a bootstrap driver stage with transistors T25 to T30, and capacitors C4 and C5, and an output stage with transistors T31 and T32.

With respect to its structure and operation, write driver 15 substantially corresponds to the circuit in co-pending U.S. patent application, Ser. No. 66,595, filed Aug. 14, 1979, so that no detailed specification need be given here. However, the operation of this driver will be briefly described below as far as necessary for understanding the write operation.

In the standby state, i.e., when chip selection signal CE is on the upper level and the other control signals of write driver 15 are on the lower level, the outputs of the latch, i.e., the gate electrodes of transistors T20 and T21 and consequently also the inputs of the bootstrap stage, i.e., the control electrodes of transistors T27 and T28, are all charged by the refresh stage T22 to T24 to the potential VH-VT. Input transistor T18 is thus rendered non-conductive so that an information signal that might be applied at its gate electrode is not detected. Bootstrap drive transistors T27 and T28 maintain output transistors T31 and T32 in the non-conductive state owing to signal WG=0 V. At the pair of output terminals 17, 19 of write driver 15 standby potential VH-VT is present, via refresh transistors T7' and T8' of I/0-latch 14, with transistor T9' safely preventing a possible voltage difference between the two cross-coupled gate electrodes.

Prior to the selection of chip activating pulse CE to its low state, information is provided at data input 23. When chip activation pulse CE adopts its lower level, input transistor T18 is activated, i.e., a high drain-source voltage is formed and depending on whether a logical Zero or One is applied, transistor T18 remains non-conductive or assumes the conductive state. If there is a logic Zero input signal, the gate potential of transistor T20 is slightly increased via coupling capacitor C3, with the rising edge of control pulse PS, whereas in the case of a logic One the gate potential is reduced by approximately the same amount by the conductive transistor T18 in spite of the same coupling-in. In both cases, the standby potential at the control electrode of transistor T21 is maintained. Due to the thus produced differential voltage, the latch assumes one of the two possible preferential states.

As soon as set pulse PS has reached the upper level, and discharge transistor T19 is fully conductive, the low differential input voltage is amplified and latched by cross-coupled transistors T20 and T21, i.e., one output of the latch is discharged to 0 V, whereas the other one substantially maintains its high starting potential (VH-VT). These potentials also appear at the corresponding gate electrode of driver transistors T27 and T28. When write instruction pulse WG rises from the lower to the upper level, the higher input-side differential voltage VH-VT is increased by the bootstrap driver stage (T27, T28; C4, C5) to provide an output voltage of VH, and 0 V at the source electrodes of T27 and T28. This differential output is latched by cross-coupled clamp transistors T29 and T30. The gate electrodes of output transistors T31 and T32 are therefore brought to voltage VH or 0 V, respectively. Therefore the one transistor of the output stage (T31, T32) with gate voltage VH is highly conductive, whereas the other one with gate potential 0 V is non-conductive. If a Zero is to be written in, data line DB1 is discharged to ground via T32, wheres data line DB0 is not influenced by switched-off transistor T31 and maintains its output potential VH-VT; this is reversed if a One is to be entered. On the data bus pair DB0 and DB1 therefore the voltage difference VH-VT is formed which is then transferred into the selected memory cell.

At the end of the selection process, control pulses PS and WG are switched off. Thus, the previously conductive output transistor (T31 or T32) is made non-conductive. With a rising CE edge this circuit is again prepared for the output state of the next writing cycle.

It should be pointed out that the write driver transforms the input side low TTL signal into a high voltage difference VH-VT at the capacitively highly loaded output. This is executed in three main steps: first, the input level is used for generating a low differential voltage at a latch; this voltage difference is then preamplified through the effect of the latch, and finally amplified again through the introduction of a control pulse with a high amplitude (VH), with the bootstrap technique having been used for that purpose. Thus, a high voltage difference, i.e., VH on the one and 0 V at the other gate electrode, is available for addressing the output stage (T31, T32).

The writing principle consists in that only one of data lines DB0 and DB1 which before had been charged to the same high potential (VH-VT), is discharged according to the information at the data input via output transistor T31 or T32, respectively, while the complementary data line remains charged.

With sufficiently great dimensions, the discharge of the very high data line capacity could be executed by the write driver alone. However, for saving layout surface the two latches 6 and 14, which are required anyway for executing a read operation, are used for supporting the discharge process.

As soon as the potential of the one data line has decreased sufficiently, the respective bit switch 11, earlier enabled by signal BS, becomes conductive. Thus a differential signal can form in time at the bit line pair, which signal cannot be changed by the information in the memory cell because at this time the cell is not yet fully selected Owing to the continuing discharge of the data line DB0 or DB1, this differential signal slightly increases via the output stage of the write driver, and upon the appearance of set pulse SE it is considerably amplified by sense latch 6 which now carries out the further discharge of the one bit line and its associated data line. With the activation of the additional I/O-latch 14 at time LE, a third discharge path is opened for the high data line capacity and, owing to the conductive bit switch 11, also for the corresponding bit line capacity CB, so that the parasitic line capacities as well as the memory node connected thereto can now be quickly discharged, whereas the complementary line capacities approximately maintain their starting potential to which the associated memory node is adapting.

Figure 4:
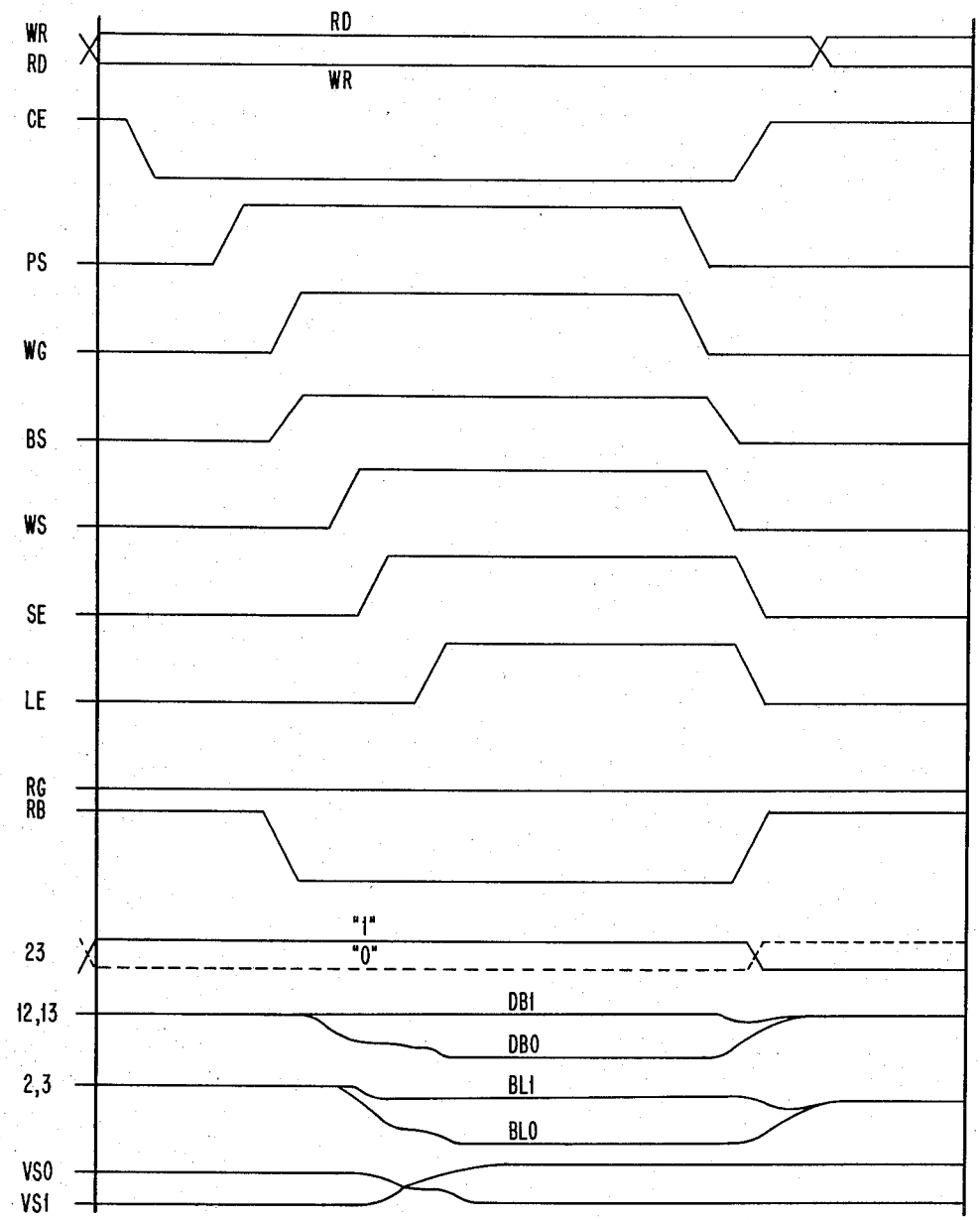

The pulse diagram according to FIG. 4 shows, for a One to be written in, the potential curves at terminals 23; 12, 31 and 2, 3 as well as the potentials VS0 and VS1 of the memory nodes. The remaining pulses in the part above that in the diagram correspond to those of FIG. 3 for the read operation. The only difference consists in that the read signal RG is at its low level in FIG. 4, and the write signal WG is at its high level.

It is thus shown that for the reading and writing of the dynamic memory according to the circuit of FIG. 2, the same pulses can be used and furthermore a plurality of circuit components are available for discharging the high parasitic capacity to the internal data lines DB0 or DB1, so that a faster reading out and writing is possible.

While the invention has been particularly shown and described with reference to a preferred embodiment, it will be understood by those skilled in the art that the foregoing and other changes in form and detail may be made therein without departing from the spirit and scope of the invention.

What is claimed is:

1. A read/write circuit for a memory system including a matrix of dynamic memory cells arranged in columns and rows, each cell having a pair of capacitive storage nodes capable of being simultaneously coupled to a dual-rail column line in response to an addressable row selection signal, a dynamic cross-coupled sense latch circuit connected to each of said dual-rail column lines for detecting and amplifying signals coupled to said column lines and a bit switch, associated with each of said column lines, responsive to an addressable column selection signal, the improvement comprising:
- a plurality of dynamic cross-coupled input/output data latches;
- a dual-rail data line coupled to each of said input/output latches and to at least some of said bit switches;
- a write driver circuit having an input terminal and including a dynamic cross-coupled latch coupled to each of said dual-rail data lines, said write driver being responsive to a data input signal and a first clock signal to provide for the selective discharge of one of the lines of said dual rail data line;
- a read driver circuit, having a single output terminal, coupled to each of said dual-rail data lines and comprising a push-pull output driver, said output driver being responsive to a differential data signal established on said dual-rail data line;
- means for enabling said sense latch circuits in response to a second clock signal subsequent to said first clock signal, said column selection signal and said row sectional signal;
- means for enabling said input/output latch subsequent to said sense latch; and
- means for independently enabling only one of said write driver and said read driver during a memory cycle whereby only one of said read and write drivers is enabled in conjunction with the enabling of said sense latches and said input/output latches.

2. The circuit of claim 1 wherein said dynamic cross-coupled sense and input/output latches each comprise first and second field effect transistors having their gate and drain electrodes cross-coupled and having their source electrodes coupled to a common node which in turn is coupled to a source of potential by a third field effect transistor.

3. The circuit of claim 2 further including dual-rail line precharge means coupled to each of said dual-rail column lines and to each of said dual-rail data lines comprising fourth and fifth field effect transistors coupled between the respective rails of said dual-rail lines and a second source of potential and a sixth field effect transistor coupled between said rails of said lines, the gate electrodes of all of said fourth, fifth and sixth transistors being responsive to a clock signal occurring at a time other than that during which said sense latch and said data latch are enabled.

4. The circuit of claim 3 wherein a common single rail data terminal is provided between the input terminal of said write driver circuit and the output terminal of said read driver circuit.

5. The circuit of claim 4 wherein each of said dynamic memory cells comprises essentially a single field effect transistor coupled between each of said capacitive storage nodes.

* * * * *